United States Patent [19]

Shindo et al.

[11] 4,336,494
[45] Jun. 22, 1982

[54] INSULATION RESISTANCE TESTER

[75] Inventors: Shotaro Shindo; Eiji Hayashi, both of Musashino, Japan

[73] Assignee: Yokogawa Electric Works, Ltd., Tokyo, Japan

[21] Appl. No.: 163,224

[22] Filed: Jun. 26, 1980

[30] Foreign Application Priority Data

Jul. 12, 1979 [JP] Japan .................................. 54/88466
Jul. 12, 1979 [JP] Japan .................................. 54/88467

[51] Int. Cl.³ .......................................... G01R 27/02
[52] U.S. Cl. ...................................... 324/62; 324/54
[58] Field of Search ................... 324/62, 54; 340/647

[56] References Cited

U.S. PATENT DOCUMENTS 2,891,219 6/1959 Camp ..................... 324/62
3,040,249 6/1962 Schwarckopf et al. .............. 324/54
3,328,685 6/1967 Hewlett .................................. 324/62
3,501,693 3/1970 Griswold .............................. 324/62

FOREIGN PATENT DOCUMENTS 192939 8/1967 U.S.S.R. ................................. 324/54

Primary Examiner—Stanley T. Krawczewicz
Attorney, Agent, or Firm—Parmelee, Bollinger & Bramblett

[57] ABSTRACT

An insulation resistance tester is provided having a logarithmic conversion circuit. A simple circuit arrangement is employed making use of a logarithmic relation between forward voltage and current of a semiconductor element, such as a diode, or a logarithmic relation between the voltage and current between the base and emitter of a transistor.

5 Claims, 7 Drawing Figures

INSULATION RESISTANCE TESTER

BACKGROUND OF THE INVENTION

The present invention relates to an insulation resistance tester having a meter with a logarithmic scale for indicating resistance values.

Various circuits have been used for logarithmic conversion in the insulation resistance tester, such as a circuit using the Zener characteristic of Zener diodes, a circuit using an approximating polygonal line provided by diodes, and so forth. The first-mentioned circuit, however, requires specially selected Zener diodes, while the second-mentioned circuit requires a large number of parts.

SUMMARY

Accordingly, the present invention provides an insulation resistance tester having a simple logarithmic conversion circuit using the fact that the voltage and current in the forward direction of a silicon diode have a logarithmic relationship, or that there is a logarithmic relationship between the base-emitter voltage and current of a transistor.

BRIEF DESCRIPTION OF THE DRAWING

The invention, together with further objects, advantages and features thereof, will be more clearly understood from the following description taken in conjunction with accompanying drawings.

DESCRIPTION OF THE PREFERRED EMBODIMENTS

Figure 1:
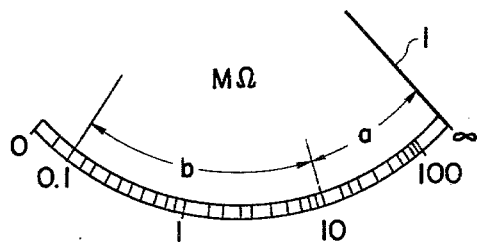
FIG. 1 is an illustrative example of a scale on the meter of an insulation resistance tester.

Referring first to FIG. 1 showing an example of the scale marked on the meter of an insulation resistance tester to which this invention pertains, reference numeral 1 denotes a pointer or hand of the meter, adapted to point to infinity ($\infty$) when no electric current is flowing through the meter. Section (a) of FIG. 1 corresponding almost to one third of the overall length of the scale has a graduation corresponding to the inverse number of the measured resistance Rx. Section (b) has a graduation corresponding to the logarithm of the measured resistance Rx. In the present specification, the term "logarithmic conversion circuit" is used to mean a circuit for realizing the graduations of the sections (a) and (b) in combination, i.e. including section (a) corresponding to the inverse number of the measured resistance Rx.

Figure 2:
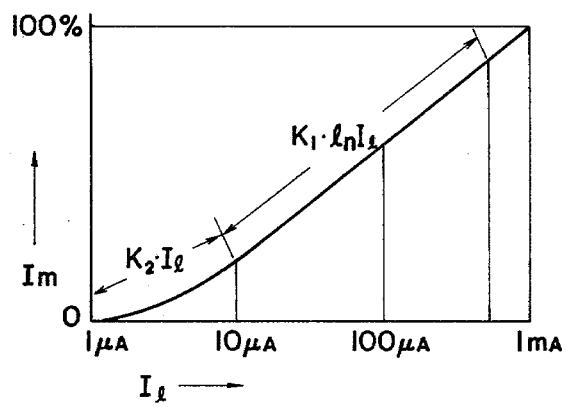
FIG. 2 is a chart showing the relationship between the current $I_e$ flowing through a measured resistance Rx and the current Im shown on the meter.

FIG. 2 shows the relationship between the electric current $I_l$ flowing through the measured resistance Rx and the current Im shown on the meter. More specifically, FIG. 2 shows, for example, that the hand of the meter is swung fully to point zero of the meter as shown in FIG. 1 when the current $I_l$ flowing in the measured resistance Rx is 1 mA, while the hand is not moved and points to infinity ($\infty$) when the current $I_l$ is not greater than 1 $\mu$A. FIG. 2 further shows that the current Im shown by the meter is proportional to the current $I_l$ when the latter falls within the range of between 1 and 10 $\mu$A, whereas the current Im shown on the meter is in proportion to the logarithm when the electric current $I_l$ exceeds 10 $\mu$A.

Figure 3:
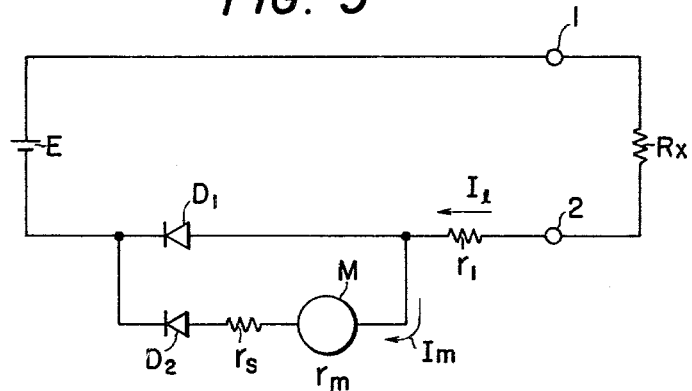
FIG. 3 is an illustrative embodiment of the invention.

FIG. 3 schematically shows the circuit arrangement of a first embodiment of the invention in which E represents a high-voltage power source while $D_1$ and $D_2$ represent diodes which are thermally balanced by each other. Symbols $r_s$ and $r_l$ denote resistances, while M represents a meter having an internal resistance $r_m$. Further, reference numerals 1 and 2 designate measurement terminals to which the resistance Rx to be measured is connected. A series circuit consisting of the high-voltage power source E, diode $D_1$ and the resistance $r_l$ is connected between the measurement terminals 1 and 2. Also, a series circuit consisting of the meter M, resistance $r_s$ and the diode $D_2$ is connected to both sides of the diode $D_1$.

The insulation resistance tester of the invention having the circuit arrangement shown in FIG. 3 operates in the following manner. The resistance Rx to be measured is connected between the measurement terminals 1 and 2. The electric current supplied from the high-voltage power source E to the measured resistance $R_x$ is represented by $I_l$ while the electric current supplied to the meter M is represented by $I_m$.

Representing the forward voltage across a diode by Vd and the forward current by Id, the following well known relationship is established.

$$I_d = I_s \cdot \{\exp(q \cdot Vd/k \cdot T) - 1\} \tag{1}$$

where,
Is: backward saturation current
q: charge of electron
k: Boltzmann's constant
T: absolute temperature Equation (1) can be transformed into equation (2) as follows:

$$Vd = (k \cdot T/q)\{l_n(Is + I_d) - l_n IS\} \tag{2}$$

On the other hand, equation 3 representing the voltages across the diodes $D_1$ and $D_2$ shown in FIG. 3 by $V_{D1}$ and $V_{D2}$, respectively is as follows:

$$V_{D1} = V_{D2} + (r_s + r_m) \cdot Im \tag{3}$$

Equation (4) is derived from the equations (2) and (3) above as follows:

$$Im = 1/(r_s + r_m) \cdot (k \cdot T/q)\{l_n(Is + I_l - Im) - l_n(Im + Is)\} \tag{4}$$

When the electric current Im in the meter is large, i.e. in the selection (b) as shown in FIG. 1, a relationship expressed by Is<Im<$I_l$ is established partly because of the fact that the electric current flowing in the diodes $D_1$ and $D_2$ is large and partly because of the presence of the resistances $r_s$ and $r_m$. Therefore, equation (4) is transformed into equation (5) as follows:

$$(k \cdot T((r_s + r_m) \cdot q)) \cdot l_n I_l = Im + (k \cdot T/((r_s + r_m)q))l_n Im \tag{5}$$

Figure 4:
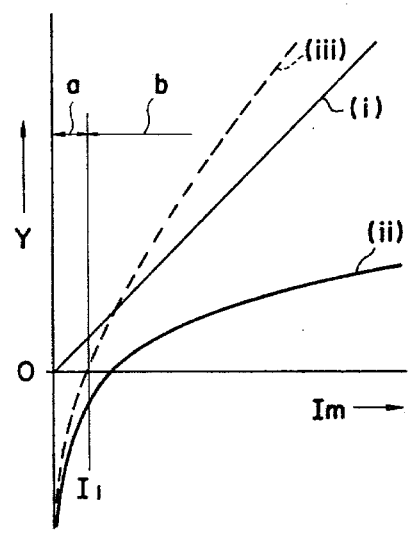
FIG. 4 is an illustration of the relation represented by a later-mentioned equation (5) or equation (15).

The right side of equation (5) is represented by Y, various values of which are illustrated in FIG. 4. Namely, line (i) represents the relationship Y=Im. Similarly, a curve (ii) shows a relationship $Y = (k \cdot T/((r_s + r$ $_m)\cdot q))l_n\cdot Im$, while a broken line curve (iii) represents the relationship $Y=Im+(k\cdot T/((r_s+r_m)q))\cdot l_n I_m$.

The line and curves in FIG. 4 are drawn in the large region of the current Im on the meter and on the assumption that $Is<<Im<<I_l$. Therefore, the section of the graph shown in FIG. 4 marked (b) (corresponds to section (b) of FIG. 1) correctly represents the magnitude corresponding to the current Im in the meter. On the other hand, the section marked (a) in FIG. 4 does not correctly represent the current Im in the meter, because in this section the current Im is small and does not meet the above-mentioned assumption.

As will be understood from the above equation, the following equation (6) is established in section (b) of FIG. 4, because the line (i) is dominative in this section.

$$Im \approx (k\cdot T/((r_s+r_m)\cdot q))\cdot l_n\cdot I_l \qquad (6)$$

From equation (6) above, it will be seen that, when the current Im is large, i.e. in section (b) of FIG. 1, the current Im in the meter is proportional to the logarithm of the current $I_l$ flowing in the resistance Rx to be measured.

When the current Im in the meter is small, $(r_s+r_m)\cdot Im$ takes a small value so that equation (7) is derived from equation (4) as follows:

$$(Is+I_l-Im)/(Im+Is) \approx 1 \qquad (7)$$

Also, equation (8) is derived from equation (7) above as follows:

$$Im \approx I_l/2 \qquad (8)$$

Thus, when the current Im in the meter is small, i.e. in section (a) shown in FIG. 1, the current Im in the meter is proportional to the current $I_l$ flowing through the resistance Rx to be measured.

Therefore, in section (a) of FIG. 1, the resistance Rx is large, and it is possible to represent the current $I_l$ by $I_l=E/Rx$. Thus, section (a) in FIG. 1 can have a graduation corresponding to the inverse number of the resistance Rx to be measured, as represented by the following equation (9).

$$Im \approx E/(2\cdot Rx) \qquad (9)$$

In section (b) shown in FIG. 1, the value of the resistance Rx to be measured is comparatively small, so that the resistance $r_1$ cannot be neglected. Thus, the current $I_l$ is represented by $I_l=E/(Rx+r_1)$. Therefore, the relationship represented by the following equation (10) is established concerning section (b) in FIG. 1.

$$Im \approx (k\ T/((r_s+r_m)\cdot q))\{l_n\cdot E-l_n(Rx+r_1)\} \qquad (10)$$

Namely, in section (b) in FIG. 1, the graduations approximate the logarithm of the resistance Rx to be measured.

Figure 5:
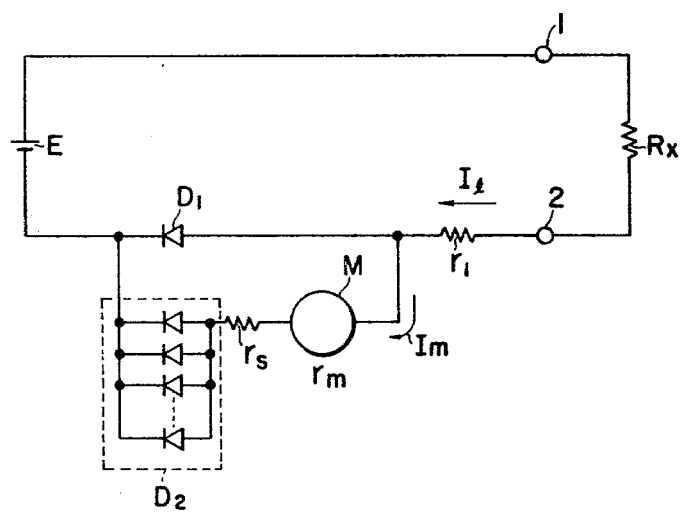
FIGS. 5 to 7 are electrical schematic illustrations of different embodiments of the invention.

In order to simplify the explanation of the invention, the circuit shown in FIG. 3 has been described on the assumption that each of the diodes $D_1$ and $D_2$ consists of only one diode. However, diodes $D_1$ and $D_2$ may be comprised of a plurality of diodes connected in series or parallel. By so doing, it is possible to adjust or change the sensitivity of the meter or to change the graduations of the meter in accordance with the use by suitably combining a plurality of diodes. For instance, if the diode $D_2$ is comprised of n diodes connected in parallel as shown in FIG. 5, equation (4) would include a constant term, while in equation (8), the right member is changed.

The diodes used in the insulation resistance tester of the invention are preferably balanced thermally. A better result will be obtained by using diodes formed on a common wafer.

Figure 6:
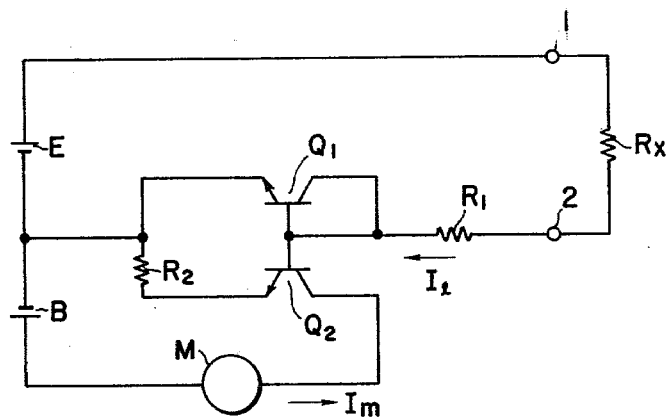

FIG. 6 shows another embodiment of the invention in which symbols B and E represent a D.C. power source and a high-voltage D.C. power source, respectively. $Q_1$ and $Q_2$ represent transistors which are thermally balanced by each other. $R_1$ and $R_2$ represent resistances, while a symbol M represents a meter having an internal resistance $r_m$. Reference numerals 1 and 2 designate measurement terminals to which the resistance $R_x$ to be measured is connected. Terminal 2 of the measurement terminals is connected through the resistance $R_1$ to the collector and base of the transistor $Q_1$ and also to the base of the transistor $Q_2$. The emitter of the transistor $Q_1$ is connected to the measurement terminal 1 through the high-voltage power source E and also to the emitter of the transistor $Q_2$ through the resistance $R_2$. Further, the emitter of the transistor $Q_1$ is connected to the collector of the transistor $Q_2$ through a series circuit of the D.C. power source B and the meter M.

In the embodiment of FIG. 6, the resistance Rx to be measured is connected between the measurement terminals 1 and 2. Representing the electric current supplied from the high-voltage power source E to the measured resistance Rx by $I_l$, the electric current flowing through the meter M by Im and the D.C. current amplification factor of the transistors $Q_1$ and $Q_2$ by $h_{FE}$, the base current of the transistor $Q_2$ is represented by $Im/h_{FE}$, while the base current of the transistor $Q_1$ is represented by $1/h_{FE}\cdot(I_l-Im/h_{FE})$.

When the measured resistance Rx is comparatively small and the current $I_l$ is large, i.e. section (b) in FIG. 1, the base current of the transistor $Q_1$ can be given by $I_l/h_{FE}$. Then the relationship represented by the following equation (11) is established, in which the voltage between the base and emitter of the transistor $Q_1$ is represented by $V_{BE1}$.

$$I_l/h_{FE}=Is\cdot\{\exp(q\cdot V_{BE1}/k\cdot T)-1\} \qquad (11)$$

Since the backward saturation current Is between the base and emitter is extremely small as compared with the base current $I_l/h_{FE}$, the equation (11) is transformed into equation (12) as follows:

$$V_{BE1}=k\cdot T/q\cdot l_n(I_l/Is\cdot h_{FE}) \qquad (12)$$

The transistor $Q_1$ is thermally balanced by the transistor $Q_2$. Representing the absolute temperature of the transistors $Q_1$ and $Q_2$ by T, the voltage $V_{BE2}$ between the base and emitter of the transistor $Q_2$ is expressed by equation (13) as follows:

$$V_{BE2}=(k\cdot T/q)\cdot l_n(Im/Is\cdot h_{FE}) \qquad (13)$$

Also, the relationship expressed by equation (14) exists in the circuit shown in FIG. 6 as follows:

$$V_{BE1}=V_{BE2}+R_2\cdot Im(1+1/h_{FE}) \qquad (14)$$

Assuming the D.C. current amplification factor $h_{FE}$ is sufficiently large to satisfy the relation $1/h_{FE}<<1$, equation (15) is derived from the preceding equations (12), (13) and (14) as follows:

$$1/R_2 \cdot (k \cdot T/q) \cdot l_n I_l = Im + 1/R_2 \cdot (k \cdot T/q) \cdot l_n \cdot Im \quad (15)$$

The equation (15) corresponds to the equation (5) mentioned in the explanation of the first embodiment. Namely, representing the right member of the equation (15) by Y, the line (i) of FIG. 4 shows the relationship $Y = Im$. Similarly, the curve (ii) and the broken line curve curve (iii) represent the relationships $Y = 1/R_2 \cdot (k \cdot T/q) \cdot l_n Im$ and $Y = Im + 1/R_2 \cdot (k \cdot T/q) \cdot l_n \cdot Im$, respectively.

Since the line (i) is dominant in section (b) of FIG. 4 as in the preceding embodiment, equation (16) is established as follows:

$$Im \approx 1/R_2 \cdot (k \cdot T/q) \cdot l_n \cdot I_l \quad (16)$$

Namely, when the current Im flowing through the meter is large, the current Im is proportional to the logarithm of the electric current flowing in the measured resistance Rx.

When the current Im flowing through the meter is small, the voltage $V_{BE1}$ between the base and emitter of the transistor $Q_1$ can be expressed by the following equation (17), because the base current of the transistor $Q_1$ is given by $1/h_{FE} \cdot (I_l - Im/h_{FE})$:

$$V_{BE1} = (k \cdot T/q) \cdot l_n 1/I_s \cdot 1/h_{FE}(I_l - Im/h_{FE}) \quad (17)$$

In addition, the second term of right member of the equation (14) can be neglected because the current Im is small, so that equation (18) is derived as follows:

$$V_{BE1} \approx V_{BE2} \quad (18)$$

Further, the following equation (19) is derived from the equations (13), (17), (18) and (19), because the D.C. current amplification factor $h_{FE}$ is expressed by $1/h_{FE} << 1$.

$$Im \approx I_l \quad (19)$$

Also, the sensitivity of the meter M can be selected as desired by adding a shunting resistance (not shown) to the meter M. As has been described, when the current Im flowing through the meter is small, i.e. in section (a) in FIG. 1, the current Im is proportional to the current $I_l$ flowing through the measured resistance $R_x$.

Therefore, in section (a) in FIG. 1, the current Im is expressed by $I_l = E/R_x$, because the measured resistance Rx is very large, so that the graduations in section (a) in FIG. 1 are marked corresponding to the inverse number of the measured resistance Rx, as in the case of the circuit shown in FIG. 3.

$$Im \approx E/R_x \quad (20)$$

In section (b) of FIG. 1, the resistance $R_1$ cannot be neglected because the measured resistance Rx is comparatively small, so that the current $I_l$ is expressed by $I_l = E/(R_x + R_1)$. Therefore, a relationship given by the following equation (21) is established in section (b) in FIG. 1.

$$Im \approx 1/R_2 \cdot (k \cdot T/q) \cdot \{l_n E - l_n (R_x + R_1)\} \quad (21)$$

Thus, in section (b) in FIG. 1, the graduations are formed approximately in proportion to the logarithm of the measured resistance $R_x$, as in the case of the circuit shown in FIG. 3.

In order to simplify the explanation of the invention, transistors $Q_1$ and $Q_2$ have been described as comprised by only one transistor. Needless to say, however, it is clear that transistors in a Darlington connection can be used for each of these transistors. Thus, in the present specification, $Q_1$ and $Q_2$ are used to designate not only single transistors but also a plurality of transistors using a Darlington connection.

As in the case of the circuit shown in FIG. 3, transistors $Q_1$ and $Q_2$ of this embodiment are preferably balanced thermally. Again a better result will be obtained if the transistors are formed on a common wafer.

In order to facilitate the understanding of the invention, an assumption has been made that transistors $Q_1$ and $Q_2$ have equal D.C. current amplification factors. The coincidence of the amplification factor, however, is not essential. Namely, the amplification factors can be treated as being constant, if there is any constant relationship between the amplification factors of transistors $Q_1$ and $Q_2$.

Figure 7:
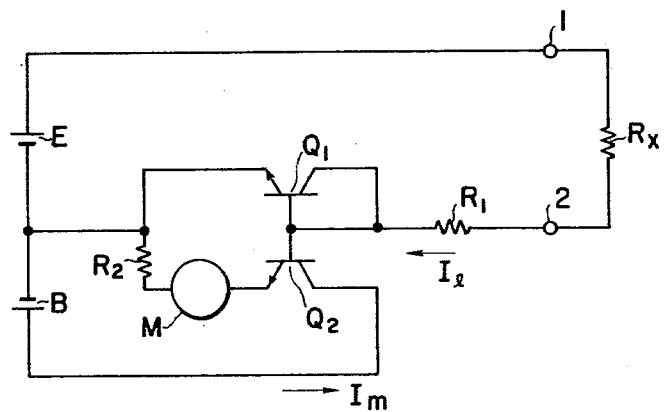

Although in FIG. 6 the meter M is connected to the collector of the transistor $Q_2$, this is not exclusive and an equivalent effect is obtained by connecting the meter M to the emitter circuit of the transistor $Q_2$ as shown in FIG. 7.

In general, meter M involves a linearity error. This error has been conventionally corrected by means of a plurality of variable resistances incorporated in polygonal line circuits. However, according to the invention, the linearity error can be corrected easily by making the current Im in the meter variable. This can be achieved by using a variable resistance as the resistance $r_s$ in the embodiment shown in FIGS. 3 and 5, and by using a variable resistance as the resistance $R_2$ in the embodiment shown in FIGS. 6 and 7.

As has been described, the present invention offers a great advantage that the logarithmic conversion in the insulation resistance tester can be achieved by means of a comparatively simple arrangement employing two diodes, resistance and a meter, or by a comparatively simple circuit incorporating two transistors, resistance and a meter.

We claim:

1. An insulation resistance tester comprising first and second semiconductor elements thermally balanced by each other, each of said semiconductor elements having a logarithmic characteristic, a series circuit including said second semiconductor element, a resistance and a meter, said first semiconductor element being connected in parallel with said series circuit.

2. An insulation resistance tester as claimed in claim 1, wherein said first and second semiconductor elements are diodes.

3. An insulation resistance tester having a logarithmic conversion circuit comprising a first and a second transistor thermally balanced by each other, said first and second transistors having D.C. current amplification factors which have a fixed relationship with respect to each other, said logarithmic conversion circuit having a meter therein coupled to said first and second transistors for making use of the relationships between the current and voltage between the base and the emitter of each of said first and second transistors.

4. An insulation resistance tester as claimed in claim 3, wherein the base and collector of said first transistor and the base of said second transistor are interconnected, said emitter of said first transistor being connected to the emitter of said second transistor through a resistance, said logarithmic conversion circuit having a serially connected power source and a meter connected to the collector of said second transistor.

5. An insulation resistance tester as claimed in claim 3, wherein the base and the collector of said first transistor and the base of said second transistor are interconnected, said emitter of said first transistor being connected to the emitter of said second transistor through a series circuit of a resistance and a meter, said logarithmic conversion circuit connected to the collector of said second transistor through a power source.

* * * * *